United States Patent [19]
Ohta

[11] Patent Number: 4,594,556
[45] Date of Patent: Jun. 10, 1986

[54] DEMODULATION CIRCUIT FROM FM SIGNALS AND DEMODULATION SYSTEM THEREFOR

[75] Inventor: Tomozo Ohta, Ikoma, Japan

[73] Assignee: Sharp Kabushiki Kaisha, Osaka, Japan

[21] Appl. No.: 632,105

[22] Filed: Jul. 18, 1984

[30] Foreign Application Priority Data

Jul. 22, 1983 [JP]  Japan ................................ 58-134982
Jul. 22, 1983 [JP]  Japan ................................ 58-134983

[51] Int. Cl.⁴ ............................................. H03D 3/00
[52] U.S. Cl. .................................... 329/137; 329/136; 329/169; 328/155; 307/510
[58] Field of Search ............... 329/110, 136, 137, 168, 329/169; 455/214; 328/155; 307/510

[56] References Cited

U.S. PATENT DOCUMENTS

3,851,263 11/1974 Fukushima et al. ................. 329/110
4,309,649 1/1982 Naito .................................... 328/155

Primary Examiner—Eugene R. LaRoche
Assistant Examiner—Robert J. Pascal
Attorney, Agent, or Firm—Birch, Stewart, Kolasch & Birch

[57] ABSTRACT

A demodulation circuit for frequency modulated signals according to this invention comprises a variable phase shifter supplied with inputted FM signals, a narrow band pass filter having a band width narrower than that of the Curson band for the FM signals, a frequency discriminator, a filter allowing specific frequency components among the FM detected signals detected by the frequency discriminator to pass, and a phase adjuster to said frequency components, wherein said inputted FM signals are passed through said variable phase shifter said narrow band pass filter and then FM detected by said frequency discriminator, a portion of the detected output signals is passed through said filter allowing to pass the specific frequency components and the phase adjuster, thereafter, the phase shifter is controlled by said signals, the phase of the FM signals is controlled by the phase shifter in the direction of compressing the frequency deviation for said specific demodulated frequency components in the FM signals, and detected signals from said frequency discriminator are taken out.

8 Claims, 12 Drawing Figures

DEMODULATION CIRCUIT FROM FM SIGNALS AND DEMODULATION SYSTEM THEREFOR

BACKGROUND OF THE INVENTION

This invention relates to highly sensitive FM signal demodulation circuit for improving the threshold characteristic at a low reception the C/N ratio (carrier power to noise power ratio), and improving the noise characteristic of demodulated signals such as broad band TV-FM (television frequency modulated) signal waves, as well as a demodulation system therefor.

Heretofore, a frequency demodulation system using a frequency discriminator comprising a LC circuit or delay line has often been employed as the most convenient way for demodulating frequency—modulated signals. In this case, the S/N ratio (signal-to-noise ratio) of FM demodulated input signals relative to the C/N ratio of FM modulated input signals is expressed as: S/N=C/N ×FI:constant) and thus the S/N ratio is in proportion to the C/N ratio. The C/N ratio is determined by the bandwidth B of a band pass filter used for restricting the bandwidth B of noises and signals upon demodulation. Usually, the bandwidth is represented according to the Curson rule as: $B \approx 2(\Delta f + fh)$ where $\Delta f$ is the frequency deviation width of the FM modulated waves and fh is the highest modulated frequency in the modulated waves.

The relationship between the C/N and the S/N ratios changes linearly as long as the CN ratio is at a level of about 10 dB or higher but, if the C/N ratio decreases further, the S/N ratio is rapidly worsened by the impulse noises inherent to the FM demodulation. This particular C/N level is referred to as the threshold.

Generally, in the communication of transmitted TV signals, such as, satellite communication, FM modulation systems have often been used for the transmission of signals. In the satellite communication lines, the power margin upon reception is restricted as low as possible in view of the limit for the transmission power of a satellite, the stability in the satellite communication paths, the stability of the transmission power of the satellite, and the economy of the ground receiving facilities. The working point is often set near the threshold. Therefore, the received input is sometimes decreased due to the fluctuations in the circumstantial conditions, and the lower the receiving level is below the threshold, the more the quality of the demodulated images on a TV monitor is significantly disturbed by the impulse noises inherent to the FM transmission. This can even lead to a state where no modulated images can be obtained.

Accordingly, in the reception of a satellite communication, it is very important to improve the impulse noises by a means that is simple; in view of the improvement in the quality of the demodulated TV images, and the economy of the receiving facilities. In a convenient satellite-receiving device such as for the reception from a broadcasting satellite, it is important to obtain a simple method for improving the threshold characteristic.

One of the systems of improving the threshold characteristic relies on FM feedback. The present invention relates to such a system.

Figure 1:
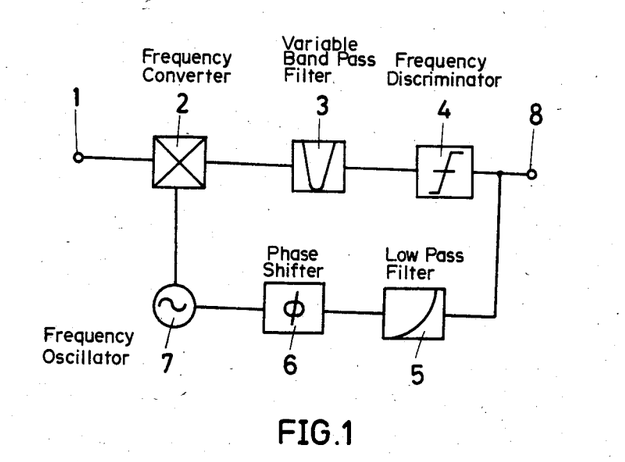
FIG. 1 is a block diagram for a FM feedback demodulation system as the basis of this invention.

FIG. 1 shows the constitution of a FM feedback modulation system.

FM signals are inputted to an input terminal 1, they are frequency modulated in a frequency converter 2, then supplied by way of a band pass filter 3 to a frequency discriminator 4 that contains an amplifier and a limiter. FM demodulated signals are derived from an output terminal 8. A portion of the base band signals demodulated in the frequency discriminator 4 is supplied by way of a low pass filter 5 to a phase shifter 6 includes a feedback amplifier. The output from the phase shifter 6 is supplied to a variable frequency oscillator 7 and the output therefrom is supplied to the frequency converter.

The base band feedback circuit comprising the low pass filter 5, the phase shifter 6 and the like, when opened, has a similar circuit structure to that of the ordinary frequency modulation system only using only a discriminator 4, wherein the bandwidth B of the band pass filter 3 requires a Curson bandwidth determined by the highest modulated frequency and the frequency deviation of the FM signals as described above.

In the FM feedback modulation circuit illustrated in FIG. 1, if the oscillation frequency from the variable frequency oscillator 7 is controlled corresponding to instantaneous frequency changes in the FM signals inputted from the input terminal 1 and if it is exerted in the direction of compressing the frequency deviation in the output signals from the frequency converter 2 as compared with that of the input signals, it is possible to narrow the Curson bandwidth required for demodulation, that is, the bandwidth of the band pass filter 3. The C/N ratio of the FM signals applied to the discriminator 4 is improved as compared with the case where there is no feedback, and the threshold characteristic can be improved.

As is well-known, the television (color video) signals relevant to this invention comprise luminant signals and a color sub carrier component, and the base band signals thereof are very broad band signals up to 4.2 MHz in the NTSC system. Further, the magnitude of the frequency spectrum for the base band signals are significantly varied in the video signals depending on the kind of images (object) to be transmitted. Particularly, the amplitude of the color sub carrier component is changed greatly depending on the density (degree of saturation) of colors of the images. Because of the inherent nature of the TV signals, several difficulties have resulted from FM demodulation in the conventional system shown in FIG. 1.

Due to such a broad band characteristic of the base band signals, it is very difficult to supply the demodulated signal component from the discriminator 4 to the variable frequency oscillator 7 by way of a feedback circuit comprising the band pass filter 5, the phase shifter 6 including the amplifier, a connection circuit with the variable frequency oscillator 7 and other appended circuits at a high stability and a fidelity. Such stability and fidelity respect to the phase and the amplitude of this demodulated signal, would allow the oscillation frequency of the variable frequency oscillator 7 to vary at a determined relationship with the frequency change in the input FM signals.

Particularly, supplying of the broad base band signals to the variable frequency oscillator 7 by means of an active circuit involves difficult problems with regard to stability in view of the circuit structure as well as the correct application of the control signals thereto. If the oscillation of the variable frequency oscillator 7 does not exactly follow the modulated frequency components of great frequency deviation in the FM signals, the frequency deviation in the output signal is made larger as compared with that in the input signal of the frequency converter 2, whereby the FM signal components are eliminated by the band pass filter 3. This results in an adverse effect, in that the C/N ratio of the signals inputted to the discriminator 4 is lowered leading to a C/N level below the threshold.

SUMMARY OF THE INVENTION

The object of this invention is to provide a highly sensitive FM signal demodulation system with an improved threshold characteristic by improving the C/N ratio.

Another object of this invention is to provide a simple method capable of overcoming the foregoing problems and improving the demodulation threshold characteristic of the frequency modulated signals modulated with TV (video) signals by utilizing the inherent nature of color TV signals to which emphasis has been applied.

Other objects and further scope of applicability of this invention will become apparent from the detailed description given hereinafter. It should be understood, however, that the detailed description and specific examples, while indicating preferred embodiments of the invention are given by way of illustration only, since various changes and modifications within the spirit and the scope of the invention will become apparent to those skilled in the art from the detailed description.

Referring briefly to this invention, a variable phase shifter and a band pass filter having a variable band width are used and the color sub-carrier signal component among the signals that are passed therethrough and demodulated in the discriminator is fed back to the variable phase shifter, to compress the frequency deviation of the color carrier modulated frequency component in the inputted FM signals. Then, after eliminating the noises to improve the signal C/N ratio by the narrow band characteristic of the band pass filter controlled by the input C/N ratio, the signals are inputted to the discriminator.

In a preferred embodiment, the variable phase shifter and the variable band pass filter may be separated individually, or they may be integrated as a variable band width and variable phase shifter.

The frequency characteristic of the FM detected signals obtained from the demodulator is such that the amplitude of the color sub carrier frequency component is lowered. Accordingly, the demodulated signals are compensated by being passed through a transmission characteristic compensation circuit having a special transmission characteristic. In the demodulating operation, the band pass width of the variable band pass filter is made broader if the input C/N ratio is greater and the band pass width is narrowed as the C/N is lowered. The color sub carrier frequency component may always be fed back to the variable phase shifter or the feedback may be interrupted at a high C/N ratio. Further, a fixed band-pass filter having a bandwidth near to the Curson bandwidth employed for the usual demodulation of FM signals is disposed at the preceeding stage of the demodulator, and the bandwidth of the variable band pass filter is made sufficiently broader than that of the fixed filter at a high C/N ratio of the signals, where the signals are demodulated with the bandwidth of the fixed band pass filter.

Further summarizing this invention, the mechanism for the demodulating operation is devised taking notice of the feature of the FM modulated signals by color TV signals subjected to preemphasis which is normally utilized. That is, a method of improving the carrier power to noise power ratio (C/N) to thereby improve the threshold is realized by applying an adverse modulation in the variable phase shifter to the component modulated by the color sub carrier which provides the greatest frequency deviation, compressing the frequency deviation of the component and passing the same through a band pass filter having the narrower band than that of the Curson band width.

Particularly, a stable and easy to design demodulation circuit can be obtained by the application of a circuit design taking notice of a specific frequency component and using a passive variable phase shifter.

BRIEF DESCRIPTION OF THE DRAWINGS

This invention will be better understood from the detailed description given herein before and the accompanying drawings which are given by way of illustration only, and thus are not limitative of this invention and wherein.

DETAILED DESCRIPTION OF THE INVENTION

Prior to the explanation for one embodiment of this invention reference will at first be made to the feature of video signals applied with emphasis. Color video signals comprise luminance signals and color signals and contain frequency components up to about 4.2 MHz in the case of the NTSC system. Among them, most of the energies of the luminance signals are concentrated to a low frequency region twice as high as the multiple of horizontal scanning frequency (15.75 KHz) and those of the color component are concentrated near 3.58 MHz. When a preemphasis circuit determined by International Radio Consultive Committee, Recommendation 405 based on a preemphasis characteristic curve decided in 1975, CCIR.REC 405-1, is applied to this kind of video signal, power weighing is given by about $-10$ dB for the lower frequency component and by about $+3$ dB for the higher frequency component of the signals. Now considering the typical color bar signals having the highest saturation degree as the video signals, the luminance signal has the greatest amplitude of 77 IRE and the color carrier component at 3.58 MHz has the frequency of 88 IRE relative to the greatest amplitude 140 IRE of the signals. Accordingly, if the weighing is carried out to the signals by the preemphasis circuit, the amplitude of the color sub carrier component is 127 IRE which is nearer to the greatest amplitude 140 IRE of the source signal. Accordingly, it can be seen that the instantaneous frequency deviation of the FM signals modulted by the video signals applied with the preemphasis provides a solution to the problem of the conventional feedback circuits.

Figure 2:
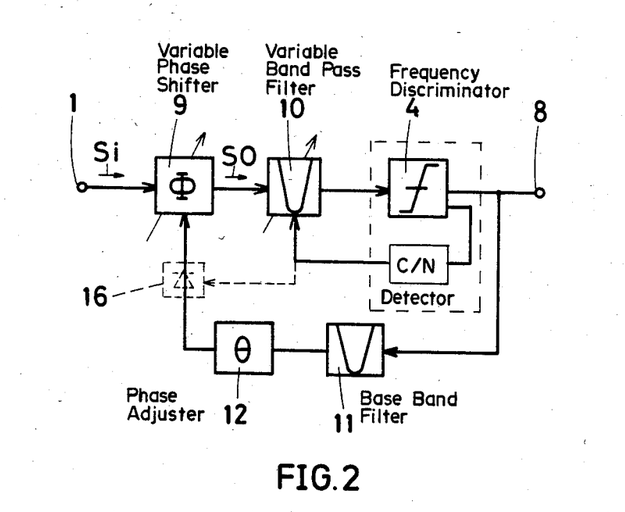
FIG. 2 is a block diagram for one embodiment of this invention.

FIG. 2 is a block diagram showing the basic constitution of one embodiment according to this invention.

FM signals are inputted from an input terminal 1, passed through a variable phase shifter 9 and a variable band pass type filter 10 and then supplied to a frequency discriminator 4. The frequency discriminator is composed of a limiter, an amplifier or the like. The output from the frequency discriminator 4 is detected at signal output terminal 8. A portion of the base band detection output from the frequency discriminator 4 is passed through a base band filter 11 allowing the color sub carrier component to pass to a phase adjuster 12 and then it is supplied to a variable phase shifter 9. C/N detection signals from the frequency discriminator 4 are inputted to the variable band pass filter 10 to limit the band width thereof. FIG. 2 shows the case where the C/N ratio is detected due to the noise output from the discriminator 4, but an additional C/N detector may be disposed or control signals from a usual automatic gain control circuit (AGC) may be used.

The color sub carrier control signals are supplied to the variable phase shifter 9 while adjusting the phase and the amplitude thereof in the phase adjuster 12 such that the frequency deviation due to the color sub carrier modulation component in the FM signals from the input terminal 1 is a compressed, that is, so-called reverse modulated state may be attained.

Then, the output of the FM signals from the variable phase shifter 9 is decreased with respect to the frequency deviation as compared with that of the input, and the signal frequency band width is narrowed. Accordingly, if the C/N ratio is lower, the noise component is eliminated by the variable band pass filter whose band width is narrowed to improve the threshold characteristic.

The effect that improves the C/N ratio, that is, the threshold improving effect in this system, will now be outlined by taking notice only of the color sub carrier frequency component as described above. The input FM signals in FIG. 2 are now represented with respect to the phase as below;

$$Si = A \sin(\omega t + a \sin pt) \quad (1)$$

The output signal from the variable phase shifter 9 are represented while omitting the fixed phase term as:

$$So = A \sin(\omega t + b \sin pt) \quad (2)$$

where $\omega$ is the center angular frequency for the FM signals, p is a modulation angular frequency which corresponds to the color sub carrier component in this case. The angular frequency deviation $\Delta\Omega$ for the input Si is represented as:

$$\Delta\Omega = ap \quad (3)$$

The angular frequency deviation $\Delta\omega$ for the output Si from the variable phase shifter is represented as:

$$\Delta\omega = bp \quad (4),$$

where a,b are constants.

Then, assuming the detection sensitivity of the discriminator 4 as K0, the gain of the amplifier in the base band filter 11 as K1 and the phase of the phase adjuster 12 as $\theta$, the control voltage e0 for the variable phase shifter 9 is represented as:

$$e0 = K0 \cdot K1 \cdot \Delta\omega \cos(pt - \theta) \quad (5)$$

While on the other hand, assuming the relationship between the phase amount $\Phi$ and the control voltage e0 of the variable phase shifter as:

$$\Phi = K2 \cdot e0 \quad (6)$$

then $$\Phi = K \cdot \Delta\omega \cos(pt - \theta) \quad (7)$$

$$k = K0 \cdot K1 \cdot K2 \quad (8)$$

The phase ($<So(\theta)$) for the output signal So from the phase shifter is represented as:

$$<So(\theta) = a \cdot \sin pt - k \cdot \cos(pt - \theta) \quad (9)$$

$$k = K \cdot \Delta\omega \quad (10)$$

Now assuming:

$$\theta + (\pi/2) = \theta 1 \quad (11)$$

then $$<So(\theta) = a \cdot \sin p \cdot t + k \cdot \sin(p \cdot t - \theta 1) \quad (12)$$

$$= C \cdot \cos(p \cdot t - \phi)$$

$$C = \{a^2 + k^2 + 2 \cdot a \cdot k \cdot \cos\theta 1\}^{\frac{1}{2}} \quad (13)$$

$$\phi = \tan^{-1} \frac{-a - k \cdot \cos\theta 1}{k \cdot \sin\theta 1} \quad (14)$$

If $$\theta = \pi/2 \ (\theta 1 = \pi) \quad (15)$$

Then, the phase $<So(\pi/2)$ in the equation (6) is represented as:

$$<So(\pi/2) = (a - k) \sin pt \quad (16)$$

Then, $$b = a - k = a - K \cdot \Delta\omega \quad (17)$$

Accordingly, the angular frequency deviation of the output So from the variable phase shifter relative to the angular frequency deviation $\Delta\Omega = ap$ for the input Si is represented as:

$$\Delta\omega = \Delta\Omega - K \cdot p \Delta\omega \quad (18)$$

and $$\Delta\omega = \frac{\Delta\Omega}{1 + K \cdot p} \quad (19)$$

That is, the angular frequency deviation for the output signal So from the variable phase shifter is compressed to $1/(1+K\cdot p)$ as compared with that for the input signal 1 under such conditions.

The signal threshold characteristic in the discriminator 4 is determined by the band width of the band pass filter accompanying the demodulation. In the case of a usual demodulator having no feedback circuit for the color sub carrier, if the Curson band width is adapted as usual for the bandwidth Bo of the band pass filter required for demodulation, it is expressed as:

$$Bo = 2(p + \Delta\Omega) \quad (20)$$

While on the other hand, the C/N ratio of the signals inputted to the discriminator 4 is determined by the band width and the noise power N is in proportion to this band width. In this invention where feedback is employed, since the frequency deviation for the FM signals is compressed, the Curson band width Bf required for the demodulation is represented as below:

$$Bf = 2\left(p + \frac{\Delta\Omega}{1 + K\cdot p}\right) \quad (21)$$

Accordingly, the degree of improvement $\eta$ for the threshold level is represented as $$\eta = \frac{Bo}{Bf} = \frac{1 + (\Delta\Omega/p)}{1 + \{\Delta\Omega/p(1 + K\cdot p)\}} \quad (22)$$

Accordingly, $\eta$ is greater than one by increasing the feedback amount K, whereby the threshold characteristic can be improved.

Upon signal demodulation, it is more advantageous that the demodulated bandwidth is somewhat narrower in view of the threshold characteristic. However, it is better that the demodulation band width is broader in view of the DG, DP characteristics of the demodulated (detected) signals, other waveform distortions, or truncation. There is no significant merit to narrowing the demodulation band width at high C/N ratio since the effects of the distortion or truncation are very much unremarkable in the demodulated images. As a countermeasure, the variable band pass filter is used to control the band width by using the detected C/N signals in this invention. Specifically, the band width of the variable band pass filter 10 shown in FIG. 2 has a broad band characteristic as the C/N ratio goes higher (for instance, at a C/N ratio defined with the Curson band width of the input signal) and it is narrowed as the C/N ratio is lowered.

Figure 3:
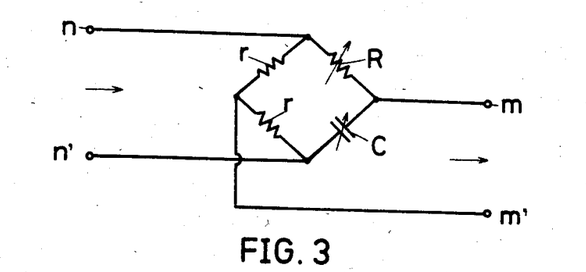
FIG. 3 is an electric circuit diagram for a specific constitution of the variable phase shifter 9.

In the system according to this invention, the use of the variable phase shifter and the variable band pass filter has an important role. There are various systems for a variable phase shifter and FIG. 3 shows one possible embodiment. This system is well known as the bridge method, in which are shown signal input terminals n,n', and output terminals m,m', as well as a resistancer, a variable resistance R and a variable capacitance C. In this embodiment, the phase of the output signal is changed by varying the variable resistance or variable capacitance. R or C may be a variable resistor or a variable capacitance diode.

Figure 4:
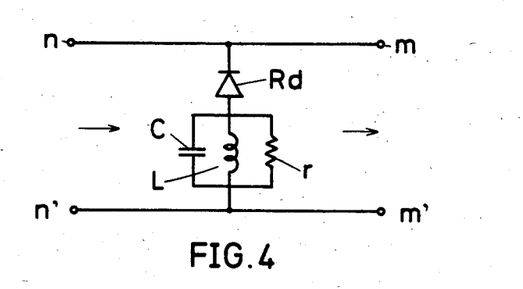
FIG. 4 is an electric circuit diagram for a specific constitution of a variable band width filter 11.

There are also considered various modes for the variable band pass filter and FIG. 4 shows one embodiment. In FIG. 4, the input resistance is omitted and the pass bandwidth of the variable filter having a single humped transmission characteristic is changed by varying the variable resistance Rd.

The feature of this system resides in the compression of the frequency deviation for the color sub carrier modulated component in the FM signals by the variable phase shifter and the elimination of the noises by the variable band pass filter. However, no compression is performed for the frequency deviation in the FM signals with respect to the signal component other than that near the color sub carrier signals among the video signals (0–4.2 MHz). Accordingly, the base band signals demodulated by the discriminator show a peculiar characteristic in the frequency characteristic. That is, the frequency characteristic of the base band signals is lowered near the color sub carrier frequency, as illustrated in FIG. 5, under the properly adjusted state of this system.

Figure 5:
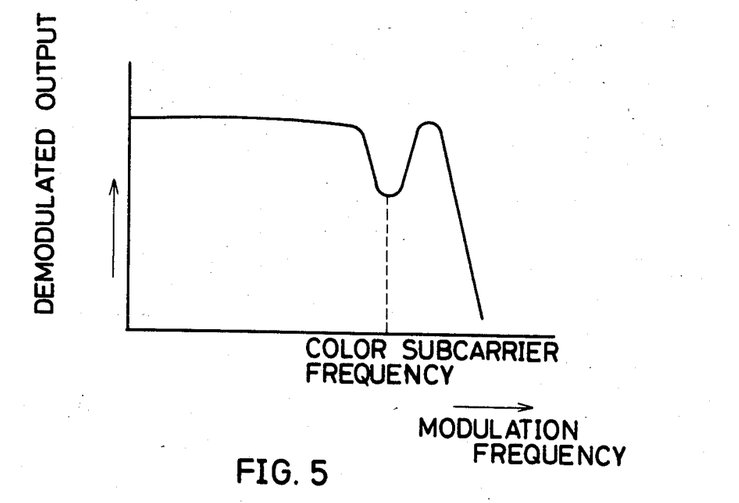
FIG. 5 is a graph showing the characteristic of the embodiment illustrated in FIG. 2.

If the phase of the feedback signals to the variable phase shifter is not appropriate, it may sometimes occur that the frequency shift for the output FM signals from the variable phase shifter is increased as compared with that for the input signals, and the demodulated base band signals may show a frequency characteristic such that the amplitude near the feedback frequency is raised as compared with that for other frequencies different from the case shown in FIG. 5. In this case, it also degrades the threshold characteristic.

Figure 6:
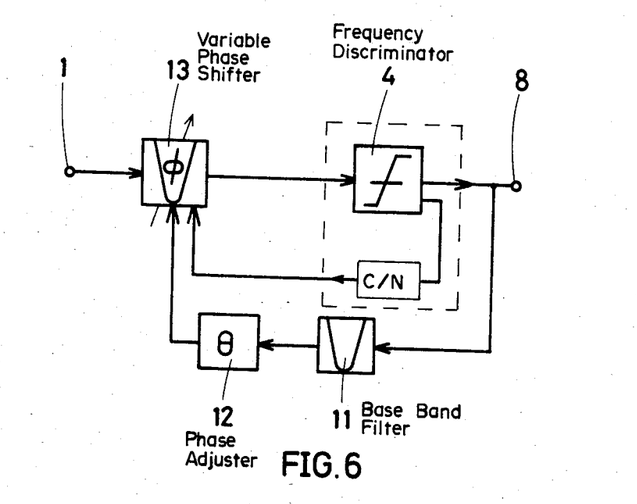
FIG. 6 is a block diagram for another embodiment of this invention.

In FIG. 6, the system shown in FIG. 2 is simplified, in which the variable phase shifter 9 and the variable band pass filter 10 in FIG. 2 are not disposed independently. They are replaced with a variable phase shifter having a function capable of varying the pass band. Reference numeral 13 represents a variable phase shifter having such a function capable of varying the pass band and the portions corresponding to those in FIG. 2 have the same reference numerals respectively.

Figure 7:
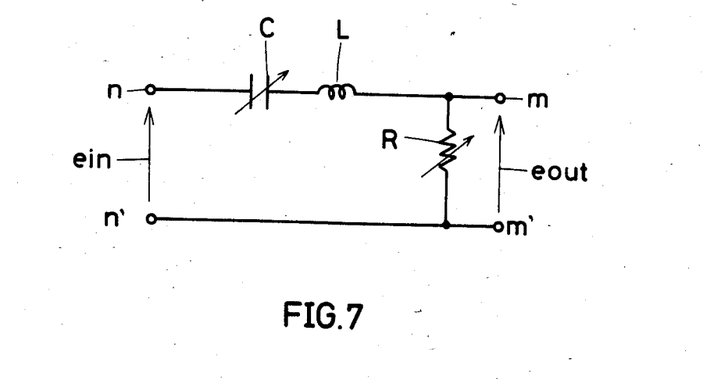
FIG. 7 is an electric circuit diagram for a specific constitution of the variable phase shifter 13.

FIG. 7 shows a specific basic embodiment of the variable phase shifter 13, in which are shown input terminals n,n' for FM signals, signal output terminals m,m', a variable capacitance C, a variable resistance R and an inductance L. A color sub carrier frequency component is applied to the variable capacitance by the phase adjuster 12 in FIG. 6 and the control signal from the C/N detector is applied to the variable resistor R.

Now assuming the input voltage $e_{in}$ in FIG. 7 as:

$$e_{in} = E \sin \omega t \quad (23),$$

the output voltage $e_{out}$ is represented as $$e \cdot \text{out} = \frac{E \cdot R}{\sqrt{R^2 + \left(\omega \cdot L - \frac{1}{\omega \cdot C}\right)^2}} \cdot \sin(\omega \cdot t - \Phi) \quad (24)$$

$$\Phi = \tan^{-1} \frac{\left(\omega L - \frac{1}{\omega C}\right)}{R} \quad (25)$$

It is rewritten as:

$$e \cdot \text{out} = \frac{E}{\sqrt{1 + \tan^2 \Phi}} \sin(\omega \cdot t - \Phi) \quad (26)$$

That is, the phase of the output voltage is changed by varying the variable capacitance C.

Figure 8:
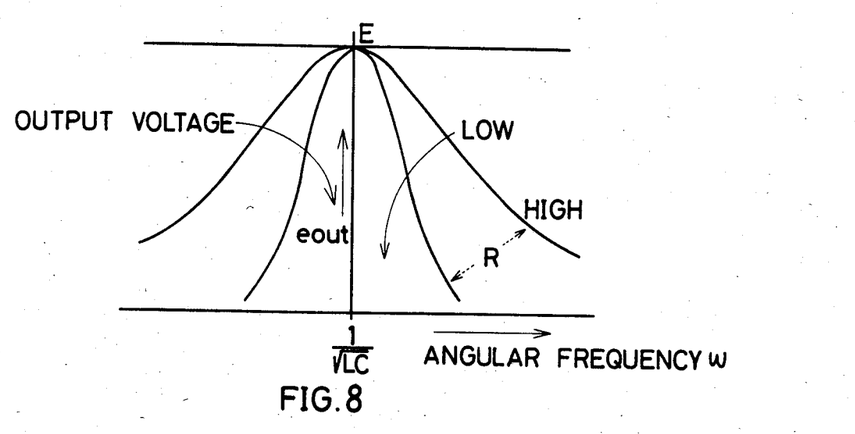
FIG. 8 and FIG. 9 are graphs respectively showing the characteristic of the variable phase shifter 13.

The transmission characteristic of FIG. 7 to the angular frequency is defined by the equation (26) as shown in FIG. 8. That is, variable band passing characteristics are obtained by varying R relative to fixed values for L and C.

Figure 9:
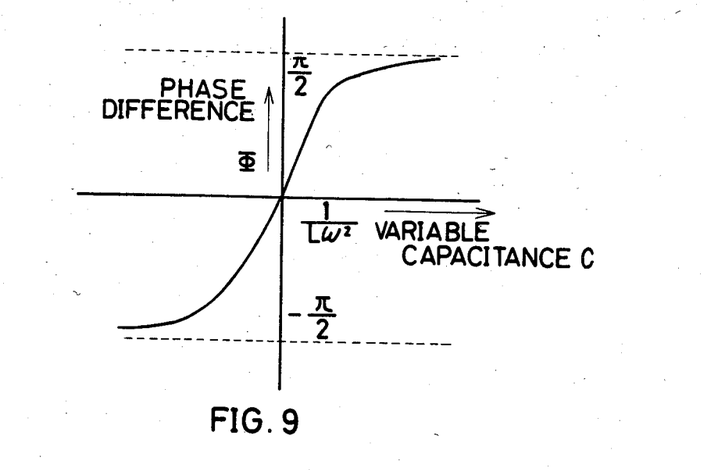

The phase difference θ between the input/output voltages is changed by varying the variable capacitance C. The relationship between C and the phase amount Φ is shown in FIG. 9. Accordingly, the frequency deviation for the FM signals due to the color sub carrier component is compressed under the optimum phase control as described above, the noise elimination, that is, the C/N ratio of the signal inputted to the discriminator can be improved by narrowing the band pass characteristic to thereby improve the threshold characteristic.

However, according to this system, it can be seen from the equation (26) that a change in the amplitude (amplitude modulation) results from a change in the phase with respect to the output signals from the variable phase shifter. Accordingly, it is necessary that the limiter used at the subsequent stage to the phase shifter have a sufficient amplitude supression effect with respect to the color sub carrier modulation frequency component to compensate for this amplitude change. While one embodiment using a serial resonance system is shown, a similar structure can also be attained by using a parallel resonance system.

In this invention, the amplitude of the FM detected signals is decreased at the compressed frequency component in view of its frequency characteristic due to the compression of the specific modulation frequency deviation as shown in FIG. 5. Accordingly, if a better characteristic is desired, it is necessary to improve the characteristic by using a compensation circuit for the frequency component.

Figure 10:
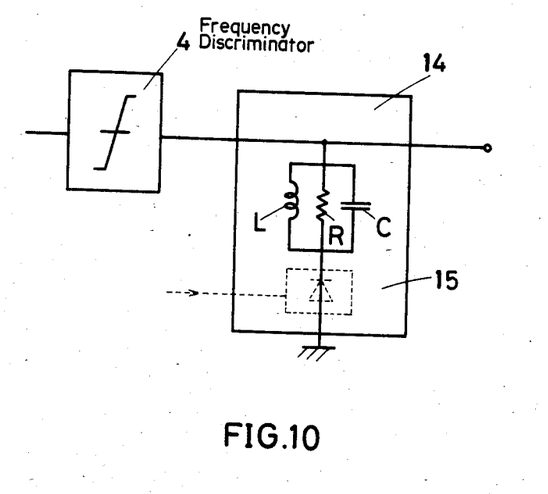
FIG. 10 is an electric circuit diagram for the specific characteristic of the characteristic compensation circuit 14.

FIG. 10 shows one embodiment of such a characteristic compensation circuit 14, in which a parallel resonance system composed of L, C, R is connected to the output of the discriminator shown in FIG. 2 or FIG. 6 to increase the load impedance at a specific frequency thereby compensating for the amplitude characteristic. The resonance frequency of the resonance system is set near the specific frequency.

It is also possible to adjust the degree of addition, elimination or compensation of the compensation circuit shown in FIG. 10 by inserting a variable resistor or switching circuit shown by a broken line 15 to the circuit shown in FIG. 10. For instance, in the case of controlling continuously or stepwise the absence or presence of the feedback of a specific base band frequency component to the variable phase shifter in this invention by means of the C/N ratio or manual control (block 16 shown in FIG. 2 controls the feedback signals by the switch or the variable resistor), FM detected signals with a better frequency characteristic can be obtained by controlling the variable resistor (or switch circuit) 15 by means of the C/N ratio or manual control corresponding to the change in the characteristic of the discriminator output.

In the simple system illustrated in FIG. 6, the feedback amount of the color sub carrier is changed and the detection characteristic for the output from the discriminator is also changed due to the variable change in the band width by the resistance R in FIG. 7. In this case to improve the overall characteristics it is effective simultaneously adjust the variable resistance 15 in the FIG. 10 by means of the C/N ratio and thereby control the degree of compensation.

Figure 11:
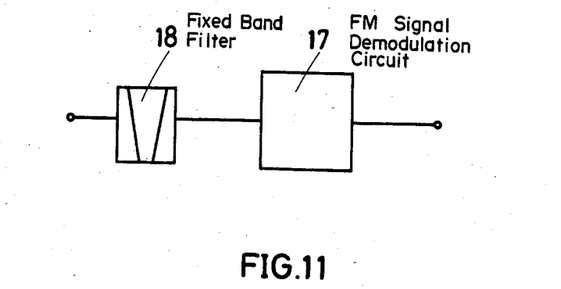
FIG. 11 is a block diagram for a further embodiment of this invention.

FIG. 11 shows another embodiment which is further developed from the foregoing embodiment of this invention. The circuit shown by the reference numeral 17 is a FM signal demodulation circuit comprising the constitution shown in FIG. 2, FIG. 6, FIG. 10 or the like, at the preceeding stage of which is connected, in a cascaded manner, a fixed band bass filter 18 having a band width near the Curson band width relative to the input FM signals. In the present system, the demodulation band width is restricted by the filter 18 at the preceeding stage in a case where the variable band pass filter (or phase shifter) in FIG. 2 or FIG. 6 has a sufficiently broad band width.

As described above, according to this invention, a highly sensitive FM signal demodulation system, simple and easy to realize, can be obtained by the use of a variable phase shifter and a variable band pass filter and by performing the feedback of specific modulated signals and the compression of the frequency deviation at a specific C/N ratio, while taking notice of the features of color TV FM modulated signals to which are applied emphasis.

This invention will now be explained by way of a further embodiment shown in FIG. 12.

The system shown in the drawing comprises an input terminal 101 for FM signals, a variable phase shifter 102 controlled by external electric signals, a narrow band pass filter 103, a frequency discriminator 104 composed of a limiter, an amplifier or the like, demodulated (detected) output terminal 105 for FM signals, a band pass filter 106 allowing to pass the component near the color sub carrier (3.58 MHz in the case of NTSC system), an amplifier 107 for the frequency component, a phase adjuster 108 relative to the frequency component or the like. The FM signals, after being inputted into the input terminal 102 and passed through the variable phase shifter 102 and the narrow band pass filter 103, are frequency modulated in the discriminator 104. A portion of the demodulated base band (video) signals is passed through the band pass filter 106 allowing to pass a specific frequency component (the component near the color sub carrier) the amplifier 107, etc. and, after being adjusted with the phase in the phase shifter 108, supplied to the variable phase shifter 102. The phase of the variable phase shifter 102 is changed by this control signal, by which the phase of the FM signals inputted from the input terminal 101 is changed. In this state, demodulated (detected) signals of the FM signals are taken out from the demodulated output terminal 105. The constitution of the system shown in FIG. 12, except for the feedback circuit for the sub carrier component comprising the band pass filter 106, the amplifier 107 and the phase adjuster 108, as well as the variable phase shifter 102, is quite the same as the conventional frequency demodulator by the discriminator.

The most significant feature of this embodiment is to improve the threshold characteristic by compressing the frequency deviation to thereby narrow the demodulation band width by using the variable phase shifter and the feedback circuit, while taking notice of the color sub carrier signal component having the greatest frequency deviation and high modulation frequency relative to the demodulation of the video FM signals.

Figure 12:
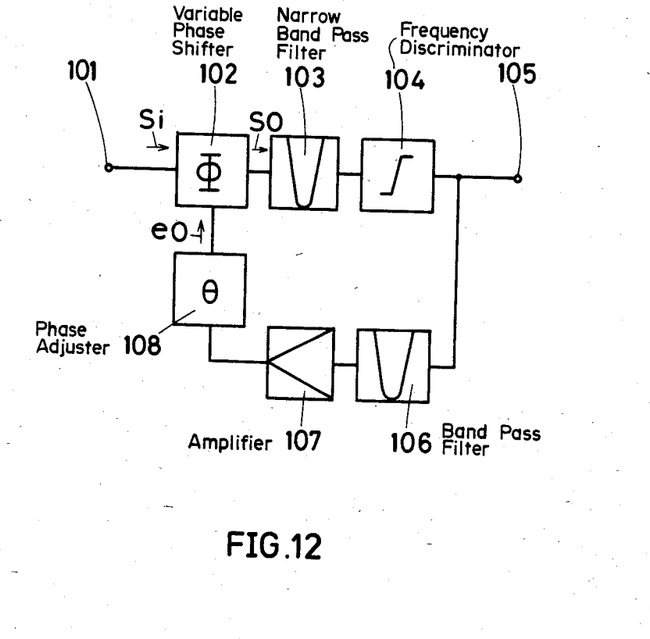
FIG. 12 is a block diagram for a still further embodiment of this invention.

In the present circuit system, the resonance frequency of its own (narrow band pass filter characteristic) can effectively be utilized and, accordingly, the narrow band pass filter 13 as shown in FIG. 12 can be saved by providing the circuit with the band pass characteristic narrower than the Curson band width to thereby effectively simplify the circuit structure.

It is to be noted in this embodiment that the frequency deviation of the specific demodulated frequency component in the FM signals is compressed by the variable phase shifter and the C/N ratio is improved by the circuit having the narrow band pass in characteristic to thereby improve the threshold characteristic.

Furthermore, a stable circuit can be provided by using the passive variable phase shifter and the feedback of the specific frequency component.

The circuits shown in FIGS. 3, 5, 7, 9 and 10 as described for the previous embodiments can also be used in the embodiment shown in FIG. 12 but detailed explanations are not repeated here.

As described above, this invention can provide extremely effective means of maintaining good noise characteristics, particularly, for those systems in which a threshold margin is restricted such as in the receiving facility for the broadcasting satellite, as well as the simplicity and the cost reduction that are required.

The invention being thus described, it will be obvious that the same may be varied in many ways. Such variations are not to be regarded as a departure from the spirit and the scope of the invention, and all such modifications are intended to be included within the scope of the following claims.

What is claimed is:

1. A demodulation circuit for frequency modulated (FM) signals comprising:
   phase shifter means for receiving inputted FM signals and shifting the phase of said FM signals in response to phase adjust control signals;
   first filter means for receiving FM signals output from said phase shifter means and passing random band FM signals continually compressed to a band width narrower than the width of the curson band for FM signals;
   frequency discriminator means for detecting said random band FM signals, outputting the same and feeding back a selected portion thereof;
   second filter means for passing specific frequency components of said selected portion; and
   phase adjuster means for adjusting the phase of said specific frequency components to generate phase adjust control signals, and applying said control signals to said phase shifter means to enable said phase shifter means to vary the phase of the FM signals in the direction of compression of said random band width.

2. The demodulation circuit of claim 1 further comprising:
   C/N detector means for determining the carrier power to noise ratio (C/N ratio) of FM signals output from said frequency discriminator means and applying a signal representative of said C/N ratio to said first filter means to compress the band width of signals passing therethrough in proportion to the C/N ratio.

3. A demodulation circuit for frequency modulated signals comprising:
   variable phase shifter means for shifting the phase of inputted frequency modulated signals also capable of compressing the pass bandwidth;
   frequency discriminator means for demodulating the signals outputted from said variable phase shifter means;
   band pass filter means for passing specific frequency components among the FM detected signals from said frequency discriminator means; and
   phase adjuster means for adjusting the phase of said specific frequency components, whereby said inputted FM signals are passed through said variable phase shifter means and then are FM detected by said frequency discriminator means and a portion of said detected signal is passed through said band pass filter means to said phase adjuster means where said phase shifter means is controlled by said phase adjuster means in the direction of compression of the pass bandwidth and detected signals from said frequency discriminator means are output.

4. The demodulation circuit of claim 3 further comprising a C/N detector means for detecting the carrier to noise ratio of the signals from the frequency discriminator and adjusting said variable phase shifter in response to changes in said carrier to noise ratio.

5. The demodulation circuit of claim 2, further comprising a parallel resonance system including an inductance, a resistance and capacitance, that is connected to the output of said frequency descriminator means for compensating for amplitude variations at the resonant frequency of said resonance system.

6. The demodulation circuit of claim 5 further comprising a fixed band pass filter at a stage preceding said variable phase shifter, connected in a cascaded manner with said variable phase shifter, having a bandwidth near a Curson bandwidth relative to the inputted FM signals.

7. The demodulation circuit of claim 3 for use in a color television receiver wherein said specific frequency components are the color subcarrier control signals of the FM signals input to said receiver.

8. The demodulation circuit of claim 1 for use in a color television receiver wherein said specific frequency components are the color subcarrier control signals of the FM signals input to said receiver.

* * * * *